May 10, 1966 E. M. DAVIS, JR 3,250,964

SEMICONDUCTOR DIODE DEVICE AND METHOD OF MAKING IT

Filed April 28, 1961 2 Sheets-Sheet 1

INVENTOR
EDWARD M. DAVIS, JR.

BY Everett A. Gastrell
ATTORNEY

United States Patent Office 3,250,964

Patented May 10, 1966

3,250,964
SEMICONDUCTOR DIODE DEVICE AND METHOD OF MAKING IT

Edward M. Davis, Jr., Poughkeepsie, N.Y., assignor to International Business Machines Corporation, New York, N.Y., a corporation of New York Filed Apr. 28, 1961, Ser. No. 106,372
10 Claims. (Cl. 317—234)

The present invention is directed to mechanically sturdy semiconductor devices having small-area junctions and to the methods of making them. More particularly, the invention relates to tunnel diodes and the methods of making those devices.

The tunnel diode, like the conventional semiconductor diode, is a two-terminal semiconductor device comprising a semiconductor body or region of one conductivity type separated from another region of the opposite type by a rectification barrier or junction. However, the tunnel diode is an abrupt junction device having degenerate doping on both sides of the junction, the doping level being of the order of $10^{19}$ impurity atoms per cubic centimeter or greater. This is about four or five orders of magnitude greater than the doping level found in the usual semiconductor device. As a result, the phenomenon known as tunneling occurs during operation of the tunnel diode and the latter exhibits a negative resistance region in its current-voltage characteristic when it is forwardly biased. This phenomenon, together with that characteristic in the tunnel diode, avoid the problem or shortcoming of minority-carrier drift time which is present in most other semiconductor devices and makes the tunnel diode a fast-operating device which is desirable for many purposes such as high-speed switching and the generation of very high-frequency oscillations.

For optimum performance at high switching speeds, the size of the alloyed (PN) junction of the tunnel diode must be very small. This means that the cross-sectional dimension or diameter of that junction must be but a few microns for values of peak current of 100 milliamperes or less. At present most tunnel diodes are made by the alloy-junction technique to produce the abrupt junction. An etching operation is then required to reduce the size of the junction to the particular area which is instrumental in establishing the desired peak current and the desired N-shaped current-voltage characteristic for the tunnel diode. Such an operation, including the apparatus for performing it, is disclosed and claimed in applicant's U.S. Patent 3,196,094, filed June 13, 1960, entitled "Method of Automatically Etching an Esaki Diode" and assigned to the same assignee as the present invention. In reducing the diameter of the junction to a few microns, a very formidable fabrication problem is presented, namely that of providing adequate mechanical support for the semiconductor material about this minute junction. Additionally, thermal expansion problems associated with the supporting means for the extremely delicate junction region have also served to complicate the problem of affording adequate mechanical support.

It is an object of the present invention, therefore, to provide a new and improved method of supporting the small-area junction of a tunnel diode or similar semiconductor device.

It is another object of the invention to provide a new and improved method of affording a sturdy mechanical support for the alloy junction of a tunnel diode, which junction has a diameter of but a few microns.

It is a further object of the invention to provide a new and improved method of supporting the very small junction of a tunnel diode, which method greatly reduces thermal expansion problems in the region of the supported junction.

It is also an object of the invention to provide a new and improved tunnel diode which has an extremely small junction that is mechanically supported in a sturdy manner.

It is yet another object of the invention to provide a new and improved tunnel diode which has an alloy junction that has a diameter of a few microns and is well supported mechanically in a manner which reduces thermal expansion problems.

It is still another object of the present invention to provide an inexpensive and extremely practical method for supporting the delicate junction region of a tunnel diode.

In accordance with a particular form of the invention, a semiconductor device comprises a body of semiconductor material, an insulating member intimately attached to a surface of that body, and a body of a conductivity-determining impurity material having a first portion intimately attached to the insulating member and having a second portion located at a side portion only of the periphery of said insulating member and alloyed with the body of semiconductor material and forming a PN junction located solely adjacent the side portion of the insulating member. The PN junction having its greatest dimension no greater than 25 microns and preferably within the range of 1–25 microns.

Also in accordance with the invention, the method of making a semiconductor device comprises intimately attaching an insulating member to a surface of a semiconductor body of one conductivity type, and intimately attaching a conductivity-determining impurity of the opposite type to the exposed surface of the aforesaid member and around a side portion only of the periphery of the insulating member to a portion of the aforesaid body. The method also comprises heating of the body and the impurity to the alloying temperature of the body and impurity to create a PN junction, located solely adjacent the side portion of the insulating member, and treating the body to reduce the maximum cross-sectional dimension of the junction to no greater than 25 microns and preferably between 1–25 microns, whereby the device has a desired electrical characteristic while the aforesaid member establishes adequate mechanical support for the junction and the semiconductor material adjacent thereto.

The foregoing and other objects, features and advantages of the invention will be apparent from the following more particular description of preferred embodiments of the invention, as illustrated in the accompanying drawings.

In the drawings:

FIGS. 1(*a*)–(*d*) are elevational and sectional views representing successive steps in the fabrication of a low impedance semiconductor device such as a tunnel diode in accordance with the prior art;

Figure 4:
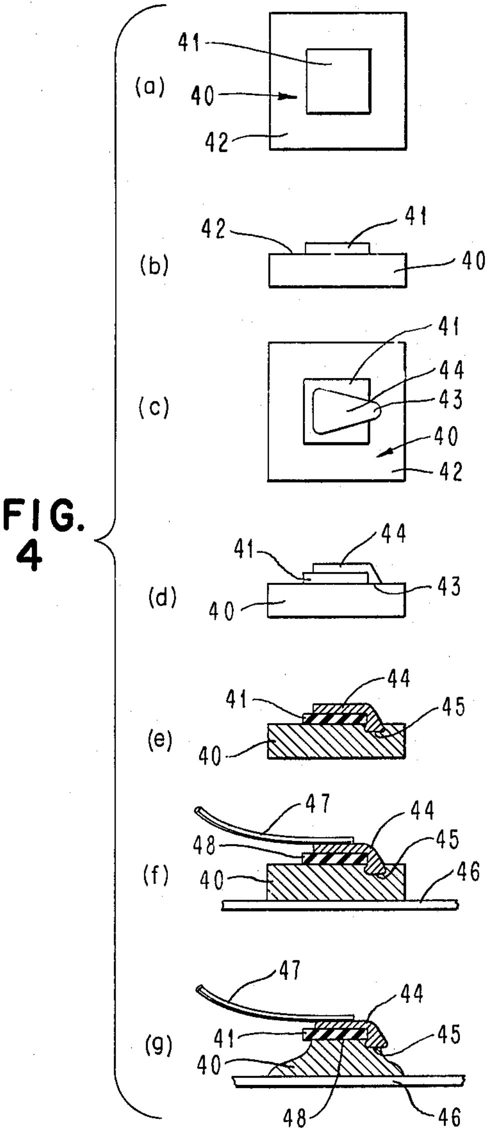
Figure 5:
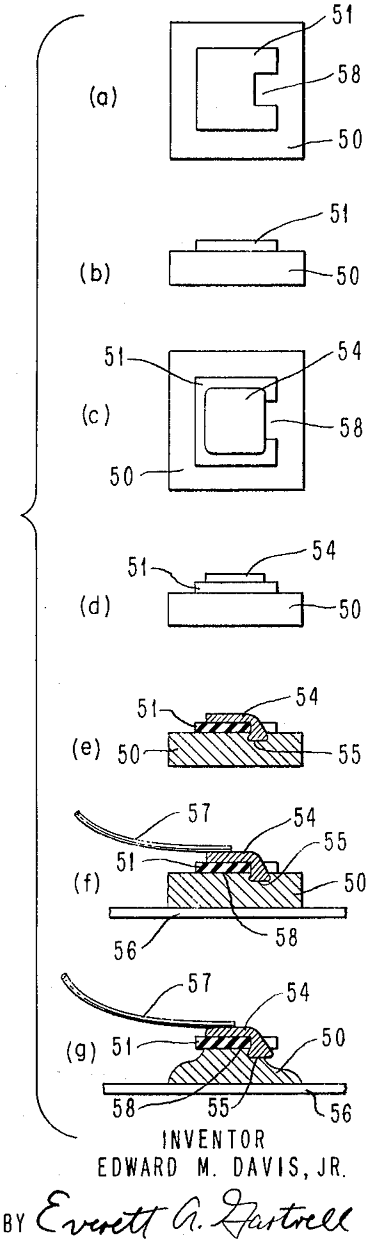

FIGS. 4(*a*)–(*g*) are plan, elevational, and sectional views representing a series of steps in the manufacture of a tunnel diode in accordance with the present invention; and FIGS. 5(*a*)–(*g*) are similar views of successive steps in the manufacture of a tunnel diode in accordance with another form of the present invention.

Figure 1:
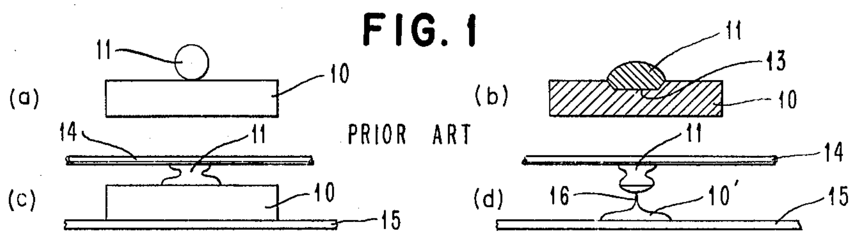

Referring now more particularly to FIG. 1(*a*) of the drawings, a body or wafer 10 of a suitable semiconductor material such as N-type germanium which is degeneratively doped to a level of the order of $10^{19}$ atoms per cubic centimeter has a dot or pellet 11 of a conductivity-determining impurity such as aluminum, boron, indium or gallium or an alloy thereof placed on a surface of the wafer. It will be understood that, if desired, highly doped P-type germanium or other highly doped semiconductor materials such as silicon, germanium-silicon alloys, silicon carbide, and intermetallic compounds such as phosphides, arsenides and antimonides of aluminum, gallium and indium may be employed as the wafer 10. In that case the impurity dot is of a suitable N-type doping material. When the wafer 10 and the dot 11 are heated in the manner well known in the art to the alloying temperature of the two, the structure of FIG. 1(*b*) results and there is created an abrupt or very thin PN junction 13. The very high impurity concentration thins the transition region of the tunnel diode to about 75 angstroms. Leads 14 and 15 are next attached to the dot 11 and to the bottom of the wafer 10 in a conventional manner, and the resultant structure is represented in the elevational view of FIG. 1(*c*). Lead 15 may be secured to the wafer 10 by a soldering operation.

Figure 3:
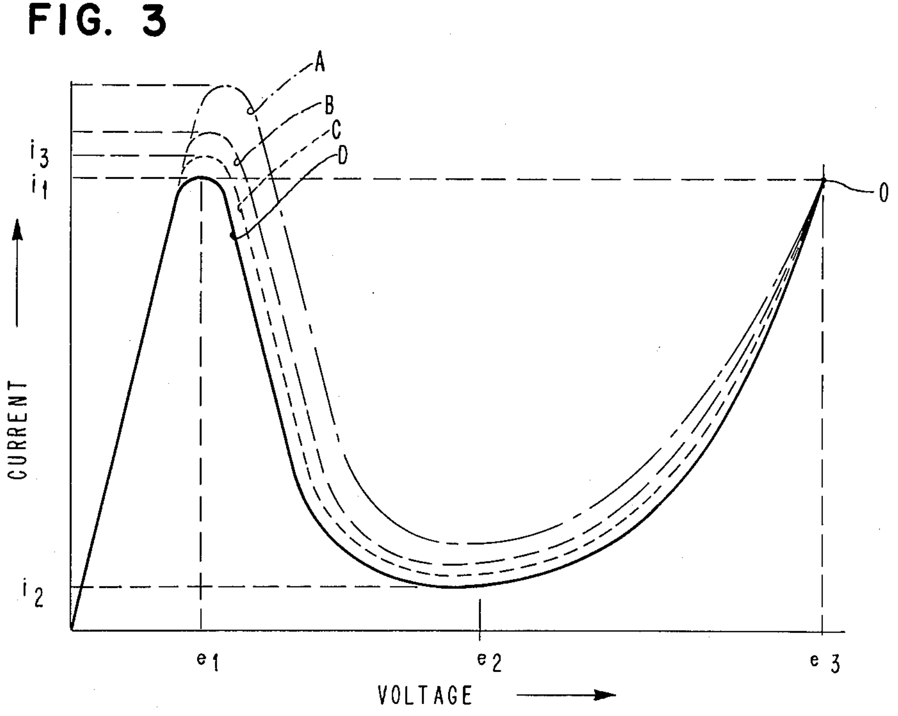
FIG. 3 is a family of curves used in explaining the operation of the apparatus of FIG. 2.

In the next operation, the structure thus formed is etched electrolytically to expose the junction by removing short circuiting material from about that junction and to secure a tunnel diode with a desired electrical characteristic. The resultant device has a generally N-shaped current-voltage characteristic as represented in FIG. 3 such that when a forward bias that is applied to the device is increased, the current rises steeply to a peak and then falls abruptly after which it flattens out into a rather broad valley before rising once again. The etching operations serve to modify the generally N-shaped current-voltage characteristic of the tunnel diode by reducing the area of the PN junction, thus reducing its peak current-carrying capacity. The etching operation to establish the desired electrical characteristic for the tunnel diode may be accomplished in the manner explained in detail and claimed in applicant's above-identified co-pending application.

Figure 2:
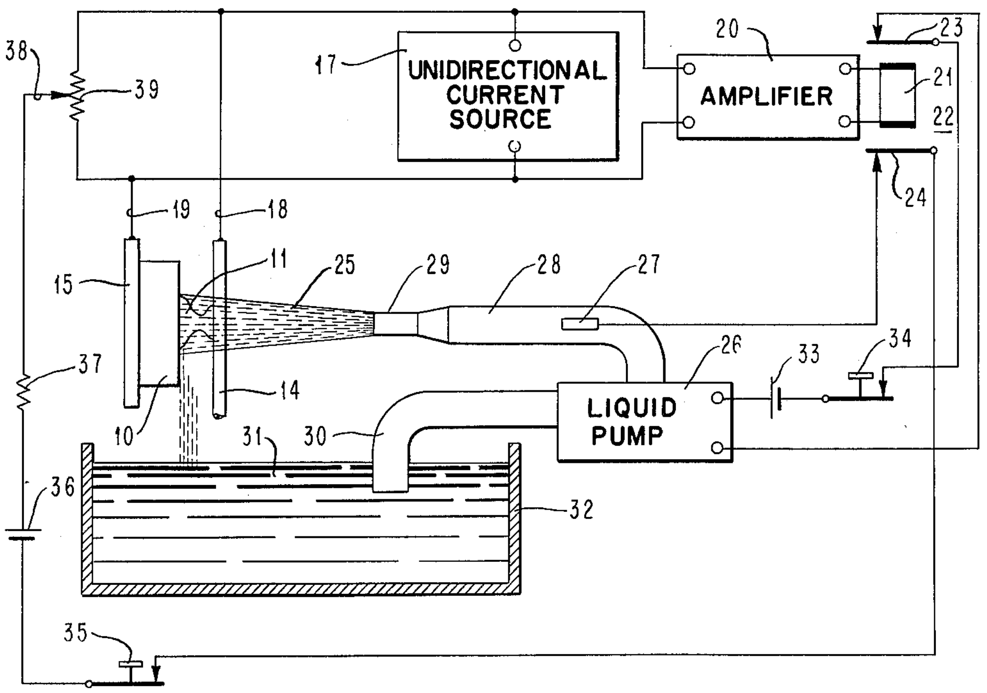
FIG. 2 is a circuit diagram of an apparatus for etching a tunnel diode.

FIG. 2 represents one form of apparatus which may be employed to etch the tunnel diode of FIG. 1(*c*) to realize the desired electrical characteristic. A unidirectional source 17 is connected by conductors 18 and 19 to the diode leads 14 and 15 for supplying to the tunnel diode a steady unidirectional current $i_3$ (see FIG. 3) substantially equal to the desired peak current of the diode. A voltage amplifier 20 of conventional construction has its input terminals connected to the source 17 and its output terminals connected to a winding 21 of a relay 22. The latter has a pair of normally closed contacts associated with armatures 23 and 24. A jet etching technique may be employed to obtain the desired electrical characteristic. To that end, a jet 25 of an alkaline solution, such as one containing 2% of sodium hydroxide by weight is forced by a liquid pump 26 over a cathode 27 resting in a conduit 28 and then through a nozzle 29 into engagement with the dot 11 and the semiconductor wafer 10 adjoining the PN junction of the diode. A pump intake 30 is disposed in the etching solution 31 in a container 32. An energy source such as a battery 33 is connected to the motor for the pump 26 through a single-pole switch 34 and the normally closed contact of the relay 22 associated with the armature 23. The cathode 27 and the electrolyte in conduit 28 of the jet etching apparatus is connected in series with the normally closed contact associated with the armature 24, which in turn is connected through a switch 35, battery 36, resistor 37, tap 38 and the two branches of a resistor 39 to the conductors 18 and 19 connected to the leads 14 and 15 of the tunnel diode. The jet 25 completes the etching circuit to the cathode 27.

In considering the etching operation of the apparatus of FIG. 2, it will be assumed that the various switches have been closed to start the pump and to complete the etching circuit and that adjustment of tap 38 has been made so that substantially equal values of etching current supplied by the battery 36 flow through the conductors 18 and 19 to the leads 14 and 15 of the tunnel diode. In the manner well understood in the art, jet etching of the tunnel diode takes place to remove material from about the region of the PN junction, thereby progressively altering the current-voltage characteristic of the diode as represented by curves A, B, C, and D of FIG. 3. The unidirectional source 17 translates through the diode a current corresponding to the level $i_3$ associated with the dotted-line curve C, the voltage corresponding to the current level being voltage $e_1$. As the erosion of the tunnel diode continues so that its peak current drops below the peak current level $i_3$ represented by curve C to the level $i_1$ of curve D, the operating point of the tunnel diode switches suddenly to point 0 on the right-hand portion of curve D, and there is developed between the leads 14 and 15 of the tunnel diode a relatively large voltage $e_3$. This change in operating point as a result of the application to the diode of the current which exceeds the peak current of the tunnel diode is well known in the art and need not be mentioned further. Amplifier 20 augments this voltage swing sufficiently to actuate the relay 22, thereby opening the normally closed switch contacts associated with the armatures 23 and 24. This in turn opens the electrical circuit from the pump 26 and the diode etching circuit, thus automatically determining the etching operation when the desired electrical characteristic is attained.

During the etching operation, the wafer 10 represented in FIG. 1(*c*) is eroded until it has the configuration of the inverted mushroom-shaped pillar 10' illustrated in FIG. 1(*d*), with a very attenuated semiconductor column 16 supporting the alloy dot 11. A very small area PN junction having a maximum cross-sectional dimension or diameter within the range of 1–25 microns is formed at the junction of the column 16 and the dot 11. The diameter of this PN junction will depend upon the desired electrical characteristic chosen for the tunnel diode, and that diameter ordinarily is but a few microns. It will be manifest that the prior art structure of FIG. 1(*d*) is extremely delicate and that the problem of providing adequate mechanical support for the junction is an exceedingly difficult if not almost impossible task, particularly when thermal expansion must be taken into consideration. However, that difficulty may be overcome by the tunnel diodes and the procedures for making them to be considered hereinafter in connection with FIGS. 4 and 5.

FIGS. 4(*a*)–(*f*) represent various steps in the procedure for making a mechanically sturdy tunnel diode. In the plan an side elevational views of FIGS. 4(*a*) and (*b*), respectively, an insulating member 41 is intimately attached to a surface of a semiconductor body 40 of one conductivity type. While the body 40 may be any of the semiconductor materials previously mentioned and of either the N or P conductivity types, as a matter of example it will be considered to be of the N-conductivity type which has been doped with arsenic to the point of degeneracy. Insulating member 41 may be any suitable insulating material applied in a manner to assure an intimate bond with the body 40. To that end, silicon monoxide or quartz are examples of materials which may be applied to the upper surface of the germanium body by evaporating a film having a thickness of the order of 0.15 mil and having a length of approximately 5 mils and a width of about the same dimension. Evaporation of the member 41 may be accomplished in a conventional manner by evaporating the silicon monoxide through an apertured molybdenum mask (not shown) so as to leave an exposed surface 42 on the top of the wafer.

Next, there is intimately attached to the exposed or top surface of the insulating member 41 and to a small portion 43 of the semiconductor body 40, as represented in FIG. 4(*d*), a body 44 of a conductivity-determining impurity of the opposite or P-conductivity type. This may be accomplished by a number of well-known techniques such as by sputtering or evaporating through a molybdenum mask a P-type impurity such as an alloy of indium and gallium. An alloy containing 98% indium and 2% gallium has proved to be useful. However, an alloy containing 96% silver, 2% indium, and 2% gallium which is evaporated on the upper surface of the insulating member 41, and an alloy containing 98% indium and 2% gallium which is evaporated on the portion 43 of the germanium body 40 and contiguous with the first-mentioned alloy has proved to be particularly useful. The ternary alloy on the insulating member has been found to have superior thermocompression bonding qualities for attaching leads in a manner to be mentioned subsequently.

In the next step, the described assembly is heated to the alloying temperature of the semiconductor body 40 and the impurity body 44 for the purpose of creating a PN junction 45, as represented in FIG. 4(*e*), between the portion 44 and the wafer 40. The extent of the doping is such that an abrupt PN junction results. Since the maximum cross-sectional dimension or diameter of the junction is much greater than is required in the finished PN junction, it is now necessary to treat the assembly including the body 40 in a manner to reduce the diameter of the junction. Prior to that operation, however, a lead 46 is ohmically attached by soldering to the base of the semiconductor wafer 40, and a lead 47 of a suitable material such as gold ribbon is theremocompression-bonded to the silver, indium, gallium alloy impurity body 44 intimately attached to the upper surface of the insulating member 41 as represented in FIG. 4(*f*). This bonding operation is in acordance wth techniques which have been published by H. W. Christensen in the April 1958 issue of the Bell Telephone Laboratories Record at pages 127 to 130. Briefly, this procedure involves the application of heat and pressure by a chisel-edged tool to the lead 47 resting on the alloy impurity body 44 so as to effect a good mechanical and electrical bond between the lead and that body.

The reduction of the diameter of the PN junction is preferably accomplished by electrolytically etching the assembly with the apparatus of FIG. 2 in the manner previously explained in connection with the prior art tunnel diode of FIG. 1(*c*). The etching operation reduces the size of the wafer 40 to the configuration represented in FIG. 4(*g*) and at the same time reduces the diameter of the PN junction to a value within the range of 1–25 microns to establish the desired current-voltage characteristic of the sort represented by curve D. of FIG. 3. In the usual tunnel diode, the junction may have a diameter of but a few microns. It will be seen from FIG. 4(*g*) that a sturdy support exists for the junction 45, this support including the horizontal expanse of the body 44 of impurity material which is anchored to the relatively large flat insulating member 41 which in turn is intimately attached to the relatively large mesa-like region 48 in the semiconductor body. Manifestly, the tunnel diode of FIG. 4(*g*) is much sturdier than the prior art structure represented in FIG. 1(*d*), and represents a practical form of a device of the type under consideration. Furthermore, a diode in accordance with the present invention desirably affords less series resistance and inductance since it does not possess the long thin column 16 of semiconductor material which is present in the prior art device of FIG. 1(*d*).

In FIGS. 5(*a*)–(*g*) there are represented steps in the manufacture of a tunnel diode in accordance with the present invention which are generally similar to those shown in FIGS. 4(*a*)–(*g*). Accordingly, corresponding elements are designated by the same reference numerals with a number 10 added thereto. Insulating member 51 may be somewhat larger than its counterpart in FIG. 4 and includes a notch 58 (FIG. 5(*a*)) which permits a portion of the rectangular body 54 of impurity material to be attached to the semiconductor material in the region of that notch. A somewhat larger area of the body of impurity material attached to the insulating member 51 causes the tunnel diode of FIG. 5(*g*) to be more sturdy than the device of FIG. 4(*g*).

In practice, the tunnel diodes of the present invention are made in arrays such that a large number of units are made on a single wafer or substrate. Prior to the etching operation, the array is severed into individual units and the diodes are individually etched to attain for each its desired electrical characteristic.

While the invention has been particularly shown and described with reference to preferred embodiments, it will be understood by those skilled in the art that the foregoing and other changes in form and details may be made therein without departing from the spirit and scope of the invention.

What is claimed is:

1. A semiconductor device comprising: a body of semiconductor material; an insulating member intimately attached to a surface of said body; and a body of conductivity-determining impurity material having a first portion intimately attached to said insulating member and having a second portion located at a side portion only of the periphery of said insulating member and alloyed with said body of semiconductor material and forming a PN junction located solely adjacent said side portion of the insulating member, said PN junction having its greatest dimension no greater than 25 microns.

2. A semiconductor device comprising: a body of semiconductor material; an oxide insulating member evaporated on a surface of said body; and a body of conductivity-determining impurity material having a first portion intimately attached to said insulating member and having a second portion located at a side portion only of the periphery of said insulating member and alloyed with said body of semiconductor material and subsequently electrolytically etched to establish a PN junction located solely adjacent said side portion of the insulating member with a maximum cross-sectional dimension within the range of 1–25 microns, whereby said device has a desired electrical characteristic and adequate mechanical support for said junction.

3. A semiconductor device comprising: a body of semiconductor material; a silicon monoxide insulating member having a thickness of about 0.15 mil evaporated on a surface of said body; and a body of conductivity-determining impurity material having a first portion with a thickness of a few microns evaporated on said insulating member and having a second portion with an area smaller than that of said first portion located at a side portion only of the periphery of said insulating member and evaporated on and alloyed with said body of semiconductor material and subsequently etched to establish a PN junction located solely adjacent said side portion of the insulating member with a maximum cross-sectional dimension within the range of 1–25 miecrons, whereby said device has a desired electrical characteristic and adequate mechanical support for said junction.

4. A tunnel diode device comprising: a body of semiconductor material highly doped with arsenic; an insulating member intimately attached to a surface of said body; an alloy body having a first portion containing 96% silver, 2% indium, and 2% gallium evaporated on said insulating member and having a second portion containing 98% indium and 2% gallium located at a side portion only of the periphery of said insulating member and alloyed with said body of semiconductor material; a gold lead thermocompression bonded to said first portion; and a conductive connection bonded to said body of semiconductor material; said alloy body and said body of semiconductor material being conditioned to establish an abrupt PN junction located solely adjacent said side portion of the insulating member with a maximum cross-sectional dimension no greater than 25 microns, whereby said device has a desired electrical characteristic and adequate mechanical support for said junction.

5. A tunnel diode device comprising: a body of semiconductor material highly doped with arsenic; a silicon monoxide insulating member having a thickness of about 0.15 mil evaporated on a surface of said body; an alloy body having a first portion with a thickness of a few microns evaporated on said insulating member and containing 96% silver, 2% indium, and 2% gallium and having a second portion containing 98% indium and 2% gallium and located at a side portion only of the periphery of said insulating member and having an area much smaller than that of said first portion evaporated on and alloyed with said body of semiconductor material; a gold lead thermocompression bonded to said first portion; and a conductive connection bonded to said body of semiconductor material; said alloy body and said body of semiconductor material being subsequently electrolytically etched to establish an abrupt PN junction located solely adjacent said side portion of the insulating member with a maximum cross-sectional dimension of no greater than 25 microns, whereby said device has a desired electrical characteristic and adequate mechanical support for said junction.

6. A tunnel diode device comprising: a body of semiconductor material highly doped with gallium; an oxide insulating member having a thickness of about 0.15 mil intimately attached to a surface of said body; and a lead-arsenic alloy body having a first portion with a thickness of a few microns evaporated on said insulating member and having a second portion located at a side portion only of the periphery of said insulating member and evaporated on and alloyed with said body of semiconductor material; a gold lead thermocompression bonded to said first portion; and a conductive connection bonded to said body of semiconductor material; said alloy body and said body of semiconductor material being subsequently etched to establish an abrupt PN junction located solely adjacent said side portion of the insulating member with a maximum cross-sectional dimension within the range of 1–25 microns, whereby said device has a desired electrical characteristic and adequate mechanical support for said junction.

7. A tunnel diode device comprising: a body of semiconductor material highly doped with gallium; an oxide insulating member having a thickness of about 0.15 mil intimately attached to a surface of said body; a tin-arsenic alloy body having a first portion with a thickness of a few microns evaporated on said insulating member and having a second portion located at a side portion only of the periphery of said insulating member and evaporated on and alloyed with said body of semiconductor material; a gold lead thermocompression bonded to said first portion; and a conductive connection bonded to said body of semiconductor material; said alloy body and said body of semiconductor material being subsequently etched to establish an abrupt PN junction located solely adjacent said side portion of the insulating member with a maximum cross-sectional dimension of no greater than 25 microns, whereby said device has a desired electrical characteristic and adequate mechanical support for said junction.

8. The method of making a semiconductor device comprising: intimately attaching an insulating member to a surface of a semiconductor body of one conductivity type; intimately attaching a conductivity-determining impurity of the opposite type to the exposed surface of said member and at a side portion only of the periphery of said insulating member and to a portion of said body; heating said body and said impurity to the alloying temperature of said body and said impurity to create a PN junction located solely adjacent said side portion of the insulating member; and treating said body to reduce the maximum cross-sectional dimension of said junction to between 1–25 microns, whereby said device has a desired electrical characteristic while said member establishes adequate mechanical support for said junction and the semiconductor material adjacent thereto.

9. The method of making a tunnel diode comprising: evaporating an oxide insulating member on a surface of a highly doped semiconductor body of one conductivity type; evaporating a silver alloy film on the exposed surface of said member; evaporating a conductivity-determining impurity of the opposite type on said silver alloy film and on a side portion only of the periphery of said insulating member and on a portion of said body; heating said body and said impurity to the alloying temperature of said body and said impurity to create a PN junction located solely adjacent said side portion of the insulating member; and etching said body to reduce the maximum cross-sectional dimension of said junction to between 1–25 microns, whereby said device has a desired electrical characteristic while said film and said member establish adequate mechanical support for said junction and the semiconductor material adjacent thereto.

10. The method of making a tunnel diode comprising: evaporating to a thickness of about 0.15 mil a silicon monoxide insulating member on a surface of a highly doped semiconductor body of one conductivity type; evaporating to a thickness of about 1 micron a silver alloy film on the exposed surface of said member; evaporating a conductivity-determining impurity of the opposite type on said film and on a side portion only of the periphery of said insulating member and on a portion of said body; heating said body and said impurity to the alloying temperature of said body and said impurity to create a PN junction located solely adjacent said side portion of the insulating member; attaching leads to said body and to said impurity; and electrolytically etching said body while monitoring the changing current-voltage characteristic of said device to reduce the maximum cross-sectional dimension of said junction to between 1 and 25 microns, whereby said device has a desired current-voltage characteristic while said film and said member establish adequate mechanical support for said junction and the semiconductor material adjacent thereto.

References Cited by the Examiner

UNITED STATES PATENTS

| | | | |
|---|---|---|---|
| 2,468,527 | 4/1949 | Van Geel | 317—241 |
| 2,793,332 | 5/1959 | Alexander et al. | 317—239 |
| 2,978,617 | 4/1961 | Dorendorf | 317—235 |
| 2,981,877 | 4/1961 | Noyce | 317—235 |
| 3,138,744 | 6/1964 | Kilby | 317—234 |
| 3,151,004 | 9/1964 | Glicksman et al. | 317—235 |

FOREIGN PATENTS 849,477 9/1960 Great Britain.

JOHN W. HUCKERT, *Primary Examiner.*

GEORGE N. WESTBY, *Examiner.*

JAMES D. KALLAM, *Assistant Examiner.*